(12) United States Patent
Broers

(10) Patent No.: US 9,910,367 B2
(45) Date of Patent: Mar. 6, 2018

(54) LITHOGRAPHIC APPARATUS, METHOD FOR POSITIONING AN OBJECT IN A LITHOGRAPHIC APPARATUS AND DEVICE MANUFACTURING METHOD

(71) Applicant: ASML Netherlands B.V., Veldhoven (NL)

(72) Inventor: Sander Christiaan Broers, Weert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/303,192

(22) PCT Filed: Apr. 15, 2015

(86) PCT No.: PCT/EP2015/058209
§ 371 (c)(1),
(2) Date: Oct. 10, 2016

(87) PCT Pub. No.: WO2015/158793
PCT Pub. Date: Oct. 22, 2015

(65) Prior Publication Data
US 2017/0031249 A1    Feb. 2, 2017

(30) Foreign Application Priority Data
Apr. 16, 2014   (EP) .................................. 14164988

(51) Int. Cl.
*G03B 27/58*     (2006.01)
*G03F 7/20*      (2006.01)

(52) U.S. Cl.
CPC ...... *G03F 7/70775* (2013.01); *G03F 7/70716* (2013.01); *G03F 7/70991* (2013.01)

(58) Field of Classification Search
CPC ............. G03F 7/70775; G03F 7/70716; G03F 7/70725
(Continued)

(56) References Cited

U.S. PATENT DOCUMENTS 5,524,131 A * 6/1996 Uzawa ................ G03F 7/70008
378/160
6,112,834 A   9/2000 Barrett
(Continued)

FOREIGN PATENT DOCUMENTS

CN    102200698     9/2011
CN    102822749    12/2012
(Continued)

OTHER PUBLICATIONS

International Search Report and Written Opinion dated Jul. 17, 2015 in corresponding International Patent Application No. PCT/EP2015/058209.
(Continued)

*Primary Examiner* — Hung Henry Nguyen
(74) *Attorney, Agent, or Firm* — Pillsbury Winthrop Shaw Pittman, LLP

(57) ABSTRACT

A lithographic apparatus including: a first object, a second object which is moveable relative to the first object in a moving direction, a set of cables and/or tubing arranged between the first object and the second object, a guiding drum to guide the set of cables and/or tubing, the guiding drum being rotatable about a rotation axis extending perpendicular to the moving direction, a drum positioning device to position the guiding drum such that it follows movement of the set of cables and/or tubing caused by movement of the second object relative to the first object and a guiding structure to guide movement of the guiding drum in the moving direction.

20 Claims, 5 Drawing Sheets

(58) Field of Classification Search
USPC .............................................. 355/53, 72–76
See application file for complete search history.

(56) References Cited

U.S. PATENT DOCUMENTS

| | | | |
|---|---|---|---|
| 6,222,614 | B1 | 4/2001 | Ohtomo |
| 6,420,716 | B1 | 7/2002 | Cox et al. |
| 6,449,030 | B1 | 9/2002 | Kwan |
| 6,509,577 | B1 | 1/2003 | Babikian et al. |
| 6,586,754 | B1 | 7/2003 | Hultermans |
| 7,292,317 | B2 | 11/2007 | Cox et al. |
| 8,773,640 | B2 | 7/2014 | Seijger et al. |
| 9,134,630 | B2 | 9/2015 | Van Zwet et al. |
| 2005/0162634 | A1* | 7/2005 | Engwall ................ G03B 27/58 355/72 |
| 2006/0279716 | A1 | 12/2006 | Cox et al. |
| 2008/0192226 | A1 | 8/2008 | Shibazaki |
| 2011/0176123 | A1 | 7/2011 | Seijger et al. |

FOREIGN PATENT DOCUMENTS

| | | |
|---|---|---|
| CN | 102917937 | 2/2013 |
| DE | 195 40 103 | 4/1997 |
| EP | 0 469 956 | 2/1992 |
| JP | 2001-351856 | 12/2001 |
| JP | 2004-194439 | 7/2004 |
| JP | 2006-135180 | 5/2006 |
| JP | 2011-081367 | 4/2011 |
| JP | 2013-509692 | 3/2013 |
| TW | 468090 | 12/2001 |
| WO | 2011/052703 | 5/2011 |
| WO | 2014/101686 | 7/2014 |

OTHER PUBLICATIONS

Japanese Office Action dated Aug. 2, 2017 in corresponding Japanese Patent Application No. 2016-550837.
Chinese Office Action dated Jun. 2, 2017 in corresponding Japanese Patent Application No. 201580015661.4.

* cited by examiner

LITHOGRAPHIC APPARATUS, METHOD FOR POSITIONING AN OBJECT IN A LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/058209, which was filed on Apr. 15, 2015, which claims the benefit of priority of EP patent application no. 14164988.9, which was filed on 16 Apr. 2014, and which is incorporated herein in its entirety by reference.

BACKGROUND

Field of the Invention

The present invention relates to a lithographic apparatus, a method for positioning an object in a lithographic apparatus and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus usually comprises a moveable object, e.g. a support constructed to hold the patterning device, a support constructed to hold a substrate or a support that holds an optical element. To supply power to the moveable object, to exchange drive and/or measurement signals, and/or to supply cooling water to the moveable object, a set of cables and/or tubing may be provided between the moveable object and a 'fixed world'. These cables and tubing are usually, but not always, supported by a cable and tubing carrier arranged between the moveable object and the 'fixed' world, which may alternatively be referred to as a cable slab. Such a set of cables and/or tubing or the cable and tubing carrier is supported at the moveable object and at the fixed world and is usually not supported in between as it is free to move along with the moveable object. Measures may be taken to prevent sagging of the set of the cables and/or tubing or the cable and tubing carrier. An example thereof are two plates at opposite sides of the set of the cables and/or tubing or the cable and tubing carrier to force the set of the cables and/or tubing or the cable and tubing carrier into a preferred shape.

However, these plates are not able to fully prevent the set of the cables and/or tubing or the cable and tubing carrier to move perpendicular to a longitudinal axis of the set of the cables and/or tubing or cable and tubing carrier in case of relatively high accelerations of the moveable object. This movement of the set of the cables and/or tubing or the cable and tubing carrier introduces disturbance forces to the moveable object causing the position accuracy of the moveable object to decrease and furthermore increases the wear of the set of the cables and/or tubing or the cable and tubing carrier which reduces the lifetime of the set of the cables and/or tubing or the cable and tubing carrier.

SUMMARY

It is therefore desirable to provide a system in which the position accuracy of the moveable object is increased and/or the lifetime of the set of the cables and/or tubing or the cable and tubing carrier is increased.

According to an embodiment of the invention, there is provided a lithographic apparatus comprising:
  a first object;
  a second object which is moveable relative to the first object in a moving direction;
  a set of cables and/or tubing arranged between the first and second object;
  a guiding drum to guide the set of cables and/or tubing, said guiding drum being rotatable about a rotational axis extending perpendicular to the moving direction;
  a drum positioning device to position the guiding drum such that it follows movement of the set of cables and/or tubing caused by movement of the second object relative to the first object; and
  a guiding structure to guide movement of the guiding drum in the moving direction.

According to yet another embodiment of the invention, there is provided a method for positioning a second object that is moveable relative to a first object in a lithographic apparatus, comprising the following steps:
a) providing a set of cables and/or tubing arranged between the first and second object;
b) providing a guiding drum to guide the set of cables and/or tubing, said guiding drum being rotatable about a rotational axis extending perpendicular to the moving direction;
c) providing a guiding structure to guide movement of the guiding drum in the moving direction;
d) positioning the second object relative to the first object;
e) positioning the guiding drum such that it follows movement of the set of cables and/or tubing caused by movement of the second object relative to the first object.

According to a further embodiment of the invention, there is provided a device manufacturing method wherein use is made of the lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
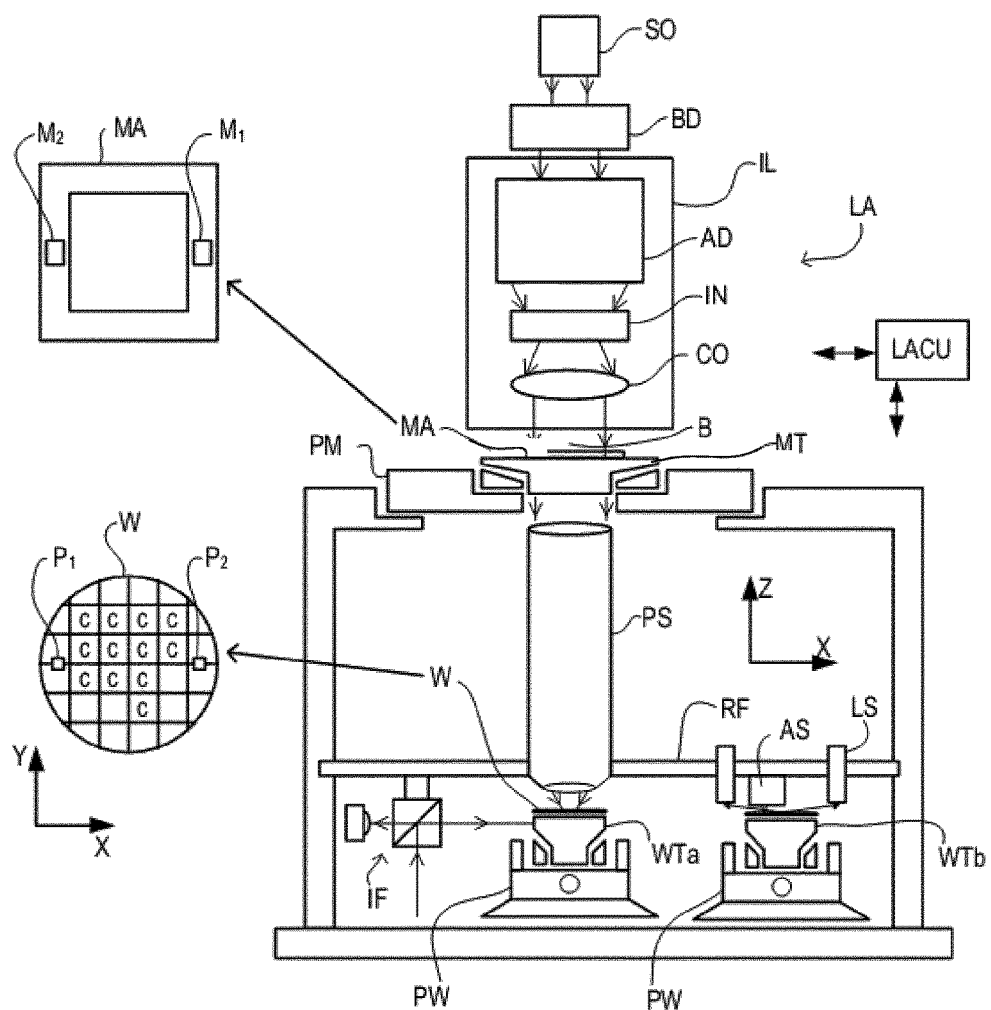
FIG. 1 schematically depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B.
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompasses all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The support structure MT supports, i.e. bears the weight of, the patterning device. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices MA include reticles, masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive patterning device MA). Alternatively, the apparatus may be of a reflective type (e.g. employing a programmable mirror array of a type as referred to above, or employing a reflective patterning device).

The lithographic apparatus may be of a type having two (dual stage) or more substrate tables WT (and/or two or more support structures). In such "multiple stage" machines the additional tables may be used in parallel, or preparatory steps may be carried out on one or more tables while one or more other tables are being used for exposure. The lithographic apparatus may comprise a measurement table that is arranged to hold measurement equipment, such as sensors to measure properties of the projection system PS. In an embodiment, the measurement table is not able to hold a substrate. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate, must be submerged in liquid, but rather only means that liquid is located between the projection system PS and the substrate W during exposure.

Referring to FIG. 1, the illumination system IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illumination system IL may comprise various other components, such as an integrator IN and a condenser CO. The illumination system IL may be used to condition the radiation beam, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (comprising e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device MA may be realized with the aid of a long-stroke module and a short-stroke module, which form part of the first positioner PM. The long-stroke module is arranged to move the short-stroke module over a long range with limited precision. The short-stroke module is arranged to move the patterning device MA over a short range relative to the long-stroke module with a high precision. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Marks located in spaced between the target portions C are known as scribe-lane alignment marks. Similarly, in situations in which more than one die is provided on the patterning device MA, the mask alignment marks M1, M2 may be located between the dies.

The depicted apparatus could be used in at least one of the following three modes:

The first mode is the step mode. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

The second mode is the scan mode. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In the third mode, the support structure MT is kept essentially stationary holding a programmable patterning device MA, and the substrate table WTa/WTb is moved or scanned while a pattern imparted to the radiation beam is projected onto a target portion C. In this mode, generally a pulsed radiation source is employed and the programmable patterning device MA is updated as required after each movement of the substrate table WTa/WTb or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables WT can be exchanged. While one substrate W on one substrate table WT is being exposed at the exposure station, another substrate W can be loaded onto the other substrate table WT at the measurement station so that various preparatory steps may be carried out. The preparatory steps may include mapping the surface of the substrate using a level sensor LS and measuring the position of substrate alignment marks P1, P2 on the substrate using an alignment sensor AS. This enables a substantial increase in the throughput of the apparatus. If the position sensor IF is not capable of measuring the position of the substrate table WT while it is at the measurement station as well as at the exposure station, a second position sensor may be provided to enable the positions of the substrate table WT to be tracked at both stations. Instead of two substrate tables WTa and WTb, the lithographic apparatus may comprise one substrate table WT and a measurement table that is arranged to hold measurement equipment, such as sensors to measure properties of the projection system PS.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the second positioner PW. Separate units may handle different actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

As described above, the mask table MT and the substrate table WTa/WTb are examples of objects within the lithographic apparatus that may need to be positioned (accurately) relative to a reference, e.g. the projection system PS.

Another example of an object that may be positionable is an optical element in a projection lens.

In order to position an object relative to a reference or reference structure within the lithographic apparatus, the lithographic apparatus comprises one or more object positioning systems according to the invention, which will be described in more detail below. Although in the remainder of this description the general term "object" will be used, it will be apparent that this term can be replaced by support, substrate table, mask table, optical element, projection lens, etc., where applicable.

Figure 2:
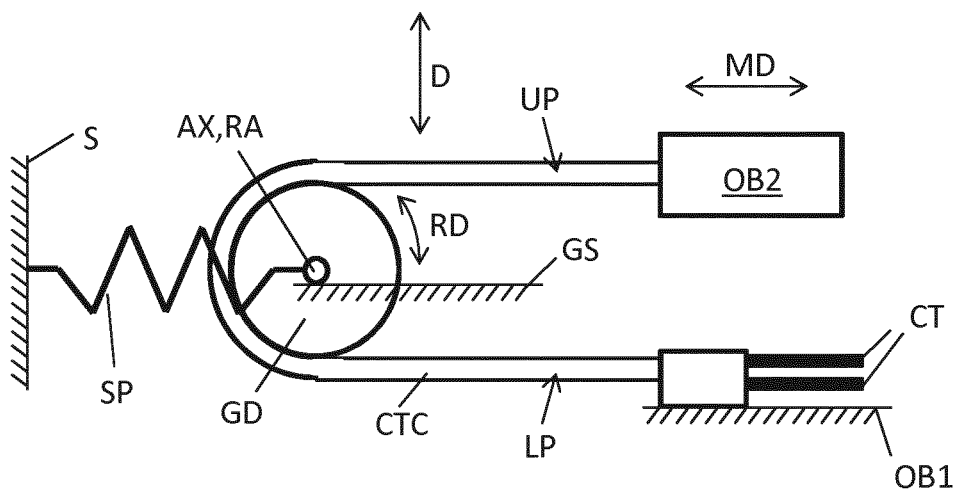
FIG. 2 schematically depicts an object positioning system according to an embodiment of the invention.

An object positioning system according to the invention is schematically depicted in FIG. 2 and comprises:

- a first object OB1, here acting as 'fixed world';
- a second object OB2, e.g. a substrate table WT or mask table MT as shown in FIG. 1, which is moveable relative to the first object OB1 in a moving direction MD;
- a set of cables and/or tubing CT, in this embodiment held by a cable and guiding carrier CTC, arranged between the first object OB1 and the second object OB2, which set of cables and/or tubing CT may provide power and/or cooling fluid to the second object OB2 and/or may exchange drive and/or measurement signals;
- a guiding drum GD to guide the cable and tubing carrier CTC, thereby guiding the set of cables and/or tubing CT, wherein the guiding drum includes an axle AX defining a rotational axis RA extending perpendicular to the moving direction around which the guiding drum can rotate (as indicated by arrow RD), in this case the axle and rotational axis extend perpendicular to the plane of the drawing;
- a drum positioning device in the form of a spring SP to position the guiding drum GD such that it follows movement of the cable and tubing carrier CTC caused by movement of the second object OB2 relative to the first object OB1; and
- a guiding structure GS to guide movement of the guiding drum GD in the moving direction MD, in this embodiment by guiding the axle AX.

The drum positioning device is in this embodiment schematically depicted as a spring SP applying a biasing force to the guiding drum GD to urge the guiding drum in the moving direction MD towards the cable and tubing carrier CTC, hence, into contact with the cable and tubing carrier CTC. The spring SP may, as shown in this embodiment, be provided between the axle AX of the guiding drum GD and a structure S, e.g. the first object OB1 or any other structure.

In an embodiment, the first object OB1 and/or structure S may be a separate frame that is uncoupled from a reference structure used for measurement purposes to minimize the influence of the applied forces to the position accuracy of the second object OB2.

The presence of the guiding drum GD has the advantage that it guides the free end of the cable and tubing carrier such that the cable and tubing carrier CTC has less freedom to move, especially in a direction D perpendicular to the moving direction MD and the axle AX. As the drum positioning device applies a biasing force, the dynamic behavior of an upper portion UP of the cable and tubing carrier CTC is minimized and thus the disturbances to the second object OB2 are minimized. For instance, buckling of the upper portion UP of the cable and tubing carrier CTC may be prevented during accelerations to the left of the second object OB2 relative to the first object OB1 in FIG. 2.

Further, the drum positioning device, in this embodiment the spring SP, may be configured to apply a substantially constant force to the guiding drum GD within a moving range of the guiding drum GD and thus apply a substantially constant force to the second object via the cable and tubing carrier CTC, thereby further minimizing dynamic disturbances. The substantially constant force applied to the second object OB2 is much easier to compensate for than dynamic disturbances.

Where the drum positioning device DPD in FIG. 2 can be a passive device having its advantages, it is also possible to actively control the position of the guiding drum GD. This is shown in the embodiment of FIG. 3.

Figure 3:
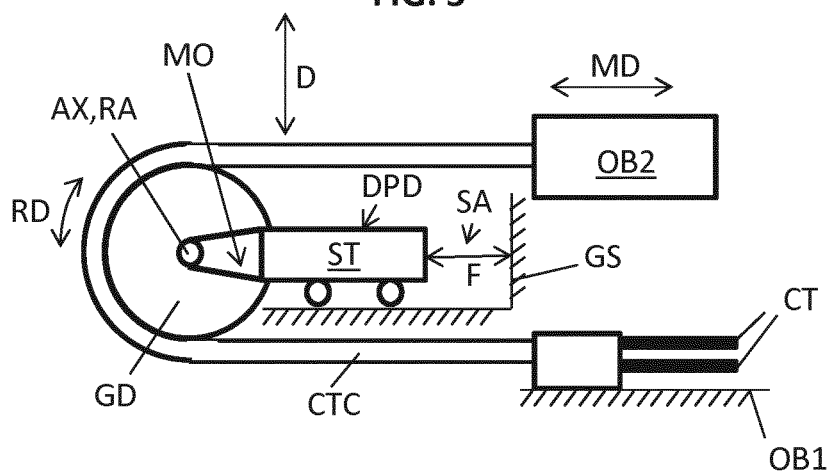
FIG. 3 schematically depicts an object positioning system according to another embodiment of the invention.

FIG. 3 depicts an object positioning system comprising a first object OB1, a second object OB2 which is moveable relative to the first object OB1 in a moving direction MD, a cable and tubing carrier CTC arranged between the first and second object to hold a set of cables and/or tubing CT, a guiding drum GD to guide the cable and tubing carrier CTC thereby guiding the set of cables and/or tubing CT, a drum positioning device DPD to position the guiding drum GD such that it follows movement of the cable and tubing carrier CTC, i.e. the set of cables and/or tubing CT, caused by movement of the second object OB2 relative to the first object OB1, and a guiding structure GS, wherein the guiding drum GD comprises an axle AX defining a rotational axis RA around which the guiding drum GD can rotate, said axle AX extending perpendicular to the moving direction MD, and wherein the guiding structure GS is configured to guide movement of the guiding drum GD in the moving direction MD.

In the embodiment of FIG. 3, the drum positioning device DPD comprises a drum support ST supporting the axle AX of the guiding drum GD thereby supporting the guiding drum GD. The drum support ST is moveably guided along the guiding structure GS, so that in this embodiment, the guiding structure GS guides the axle in an indirect manner via the drum support ST. The drum positioning device DPD further comprises a drum actuation system SA, schematically depicted here by an arrow. The drum actuation system SA is operative in between the drum support ST and the guiding structure GS to apply a force F in between the drum support ST and the guiding structure GS to position the guiding drum GD such that it follows movement of the cable and tubing carrier CTC caused by movement of the second object OB2 relative to the first object OB1.

The drum positioning device DPD may further comprise a motor MO to rotate the guiding drum GD about the rotational axis RA in a rotational direction RD. This allows to compensate for the inertia of the guiding drum to prevent slip between the cable and tubing carrier CTC and the guiding drum GD. This not only further reduces the dynamical behavior of the cable and tubing carrier CTC, but also increases the lifetime of the cable and tubing carrier and the set of cables and/or tubing CT.

Figure 4A:
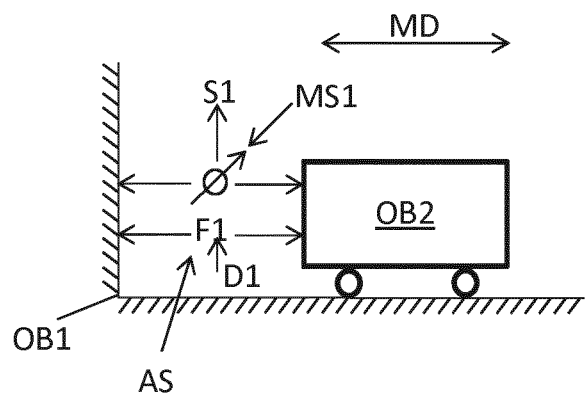
FIG. 4A depicts schematically in more detail the second object of the object positioning system of FIG. 3.
Figure 4B:
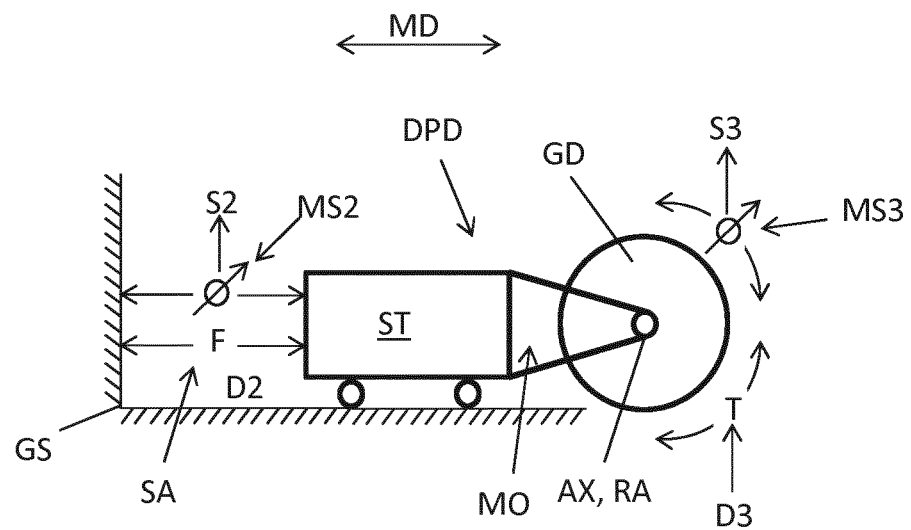
FIG. 4B depicts schematically in more detail the guiding drum of the object positioning system of FIG. 3.
Figure 4C:
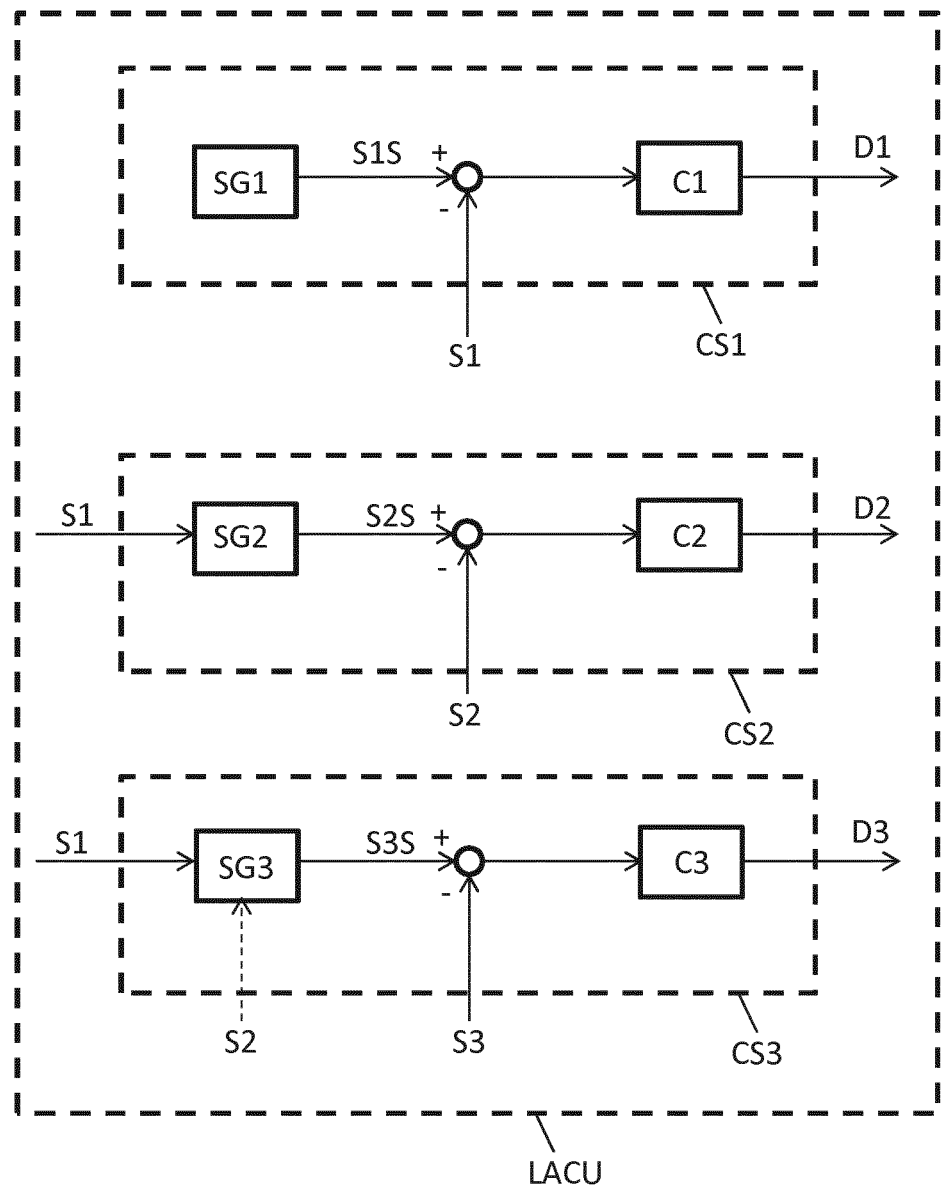
FIG. 4C schematically depicts a control scheme for controlling the object positioning system of FIG. 3.

A possible configuration for controlling the position of the second object OB2 and the guiding drum GD is schematically shown in FIGS. 4A-4C. For simplicity reasons, elements not relevant for explaining the control scheme, such as the cable and tubing carrier CTC are omitted.

FIG. 4A depicts the first object OB1 acting as a 'fixed' world for the second object OB2. A first measurement system MS1 to measure the position of the second object OB2 is provided. In this embodiment, the first measurement system MS1 measures the position of the second object OB2 relative to the first object OB1 in the moving direction, but the position may also be measured relative to any other reference structure, e.g. a dedicated measurement frame separate from the first object OB1 so that the position measurement is minimally influenced by forces applied by actuator devices and actuation systems. The first measurement system MS1 outputs a first measurement signal S1 representative for the measured position of the second object OB2 in the moving direction.

FIG. 4A also depicts an object actuation system AS to apply a force F1 between the second object OB2 and the first object OB1 in order to move the second object OB2 for positioning the second object OB2. A first control system CS1 is provided, as shown in FIG. 4C, preferably as part of the lithographic apparatus control unit LACU. The first control system CS1 is configured to drive the object actuation system AS based on the measured position of the second object OB2. The first object OB1 may be a force frame, but may also be another moveable object.

For instance, the invention may be applied in a support structure comprising a long-stroke module and a short-stroke module, wherein the long-stroke module is configured for coarse positioning the short-stroke module, and wherein the short-stroke module is configured to fine positioning the second object OB2. A cable and tubing carrier CTC may be provided between a fixed world such as a force frame and the long-stroke module, such that the first object OB1 is the fixed world and the second object OB2 is the long-stroke module. Alternatively or additionally, a cable and tubing carrier CTC may be provided between the long-stroke module and the short-stroke module, such that the long-stroke module is considered to be the first object OB1 and the short-stroke module is considered to be the second object OB2.

In an embodiment of the first control system CS1, a first set-point generator SG1 is provided outputting a first set-point S1S representative for a desired position of the second object OB2. This first set-point S1S is compared with the first measurement signal S1. A difference between the desired position, i.e. first set-point S1S, and the actual position, i.e. the first measurement signal S1, is inputted to a first controller C1, which provides a first drive signal D1 based on said difference, and which first drive signal D1 when applied to the actuation system AS urges the second object OB2 to the desired position.

Depicted in FIG. 4B is the guiding drum GD supported by the drum support ST. The drum support ST is part of the drum positioning device DPD. The drum positioning device DPD further comprises a second measurement system M52 to measure the position of the drum support ST, thereby measuring the position of the guiding drum GD in the moving direction. In this embodiment, the second measurement system M52 measures the position of the drum support ST relative to the guiding structure GS, but the position may also be measured relative to any other reference structure, e.g. a dedicated measurement frame separate from the guiding structure GS, so that the position measurement is minimally influenced by forces applied by actuator devices and actuation systems. The second measurement system M52 outputs a second measurement signal S2 representative for the position of the drum support ST in the moving direction MD and thus the position of the guiding drum GD in the moving direction MD.

FIG. 4B further depicts a drum actuation system SA to apply a force F between the drum support ST and the guiding structure GS in order to move the drum support ST for positioning the guiding drum GD. A second control system C52 is provided, see FIG. 4C, preferably as part of the lithographic apparatus control unit LACU. The second control system CS2 is configured to drive the drum actuation system SA based on the measured position of the drum support ST and based on the measured position of the second object OB2, because the guiding drum GD has to follow movement of the cable and tubing carrier CTC caused by movement of the second object OB2. Hence, the position of the second object OB2 in the form of first measurement signal S1 is inputted to the second control system C52.

In an embodiment of the second control system C52, the first measurement signal S1 is inputted to a second set-point generator SG2 to output a second set-point S2S representative for a desired position of the drum support ST. The second set-point S2S is compared to the second measurement signal S2. A difference between the desired position, i.e. the second set-point S2S, and the actual position, i.e. the second measurement signal S2, is inputted to a second controller C2, which provides a second drive signal D2 based on said difference, and which second drive signal D2 when applied to the drum actuation system SA urges the drum support ST to the desired position.

In this embodiment, the drum positioning device DPD further comprises a third measurement system M53 to measure the angular position of the guiding drum GD. In this embodiment, the third measurement system M53 measures the angular position of the guiding drum GD relative to the drum support ST, but the angular position may also be measured relative to any other reference structure, e.g. a dedicated measurement frame separate from the drum support ST. The third measurement system M53 outputs a third measurement signal S3 representative for the angular position of the guiding drum GD.

In this embodiment, the drum support comprises a motor MO to apply a torque T between the drum support ST and the guiding drum GD in order to rotate the guiding drum GD for setting the angular orientation of the guiding drum GD. A third control system C53 is provided, see FIG. 4C, preferably as part of the lithographic apparatus control unit LACU. The third control system C53 is configured to drive the motor MO based on the measured angular position of the guiding drum GD. As the guiding drum GD has to follow the movement of the cable and tubing carrier CTC caused by movement of the second object OB2, the position of the second object OB2 in the form of first measurement signal S1 may be inputted to the third control system. Additionally or alternatively the position of the drum support ST in the form of second measurement signal S2 may be inputted to the third control system M53. These possibilities are indicated by a dashed line for the inputted second measurement signal S2.

In an embodiment of the third control system C53, the first measurement signal S1 is inputted to a third set-point generator SG3 to output a third set-point S3S representative for a desired angular position of the guiding drum GD. The third set-point S3S is compared to third measurement signal S3. A difference between the desired angular position, i.e. third set-point S3S, and the actual angular position, i.e. the third measurement signal S3, is inputted to a third controller C3, which provides a third drive signal D3 based on said difference, and which third drive signal D3 when applied to the motor MO urges the guiding drum GD to the desired angular position.

As dynamic behavior of the cable and tubing carrier CTC is more relevant than the static behavior of the cable and tubing carrier CTC, the drum positioning device DPD may be configured to apply a specific static behavior. For instance, the drum positioning device DPD may be configured to apply a substantially constant tension in a part of the cable and tubing carrier CTC that extends between the guiding drum GD and the second object OB2. Said part corresponds to the upper part UP of the cable and tubing carrier CTC as shown in FIG. 2.

Applying a substantially constant tension may be implemented by the drum actuation system SA positioning the drum support ST, so that the substantially constant tension may be applied to both the upper part UP in FIG. 2 and the lower part LP in FIG. 2 of the cable and tubing carrier CTC. Alternatively or additionally, the substantially constant tension may be implemented by the motor MO rotating the guiding drum. GD, so that the substantially constant tensions in the upper and lower parts UP, LP may be different.

A non-zero tension in the upper part UP of the cable and tubing carrier CTC may be advantageous as this is beneficial to prevent buckling in the upper part UP during an acceleration of the second object to the left in FIG. 2.

In an alternative embodiment, the drum positioning device DPD comprises a measurement system including a tension sensor for measuring the tension in the part of the cable and tubing carrier CTC extending between the guiding drum and the second object OB2. A control system may be configured to position the guiding drum GD (linearly using the drum support ST and drum actuation system SA and/or angularly using the motor MO for rotating the guiding drum GD relative to the drum support), such that the measured tension remains substantially constant.

Hence, the drum positioning device DPD does not necessarily control the position of the guiding drum GD based on a measured position. A tension measurement may suffice as well. Of course, a combination of a tension measurement and a position measurement as the basis for the position control may also be carried out.

Figure 5:
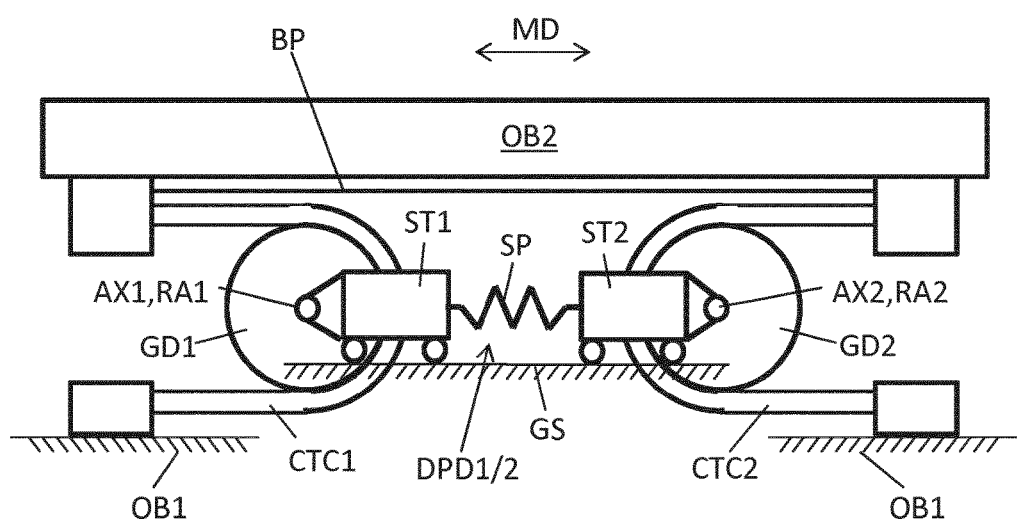
FIG. 5 depicts an object positioning system according to a further embodiment of the invention.

FIG. 5 depicts an object positioning system according to a further embodiment of the invention. A difference with previously described embodiments is that there are two, a first and a second, cable and tubing carriers CTC1, CTC2 provided between a first object OB1 and a second object OB2, wherein the first object OB1 is considered to be the 'fixed' world and the second object OB2 is moveable relative to the first object OB1 in a moving direction MD.

The first cable and tubing carrier CTC1 and the second cable and tubing carrier CTC2 are both for holding a respective set of cables and/or tubing. The first cable and tubing carrier CTC1 is guided by a first guiding drum GD1 and the second cable and tubing carrier CTC2 is guided by a second guiding drum GD2. Each of the first and second guiding drums GD1, GD2 has an associated axle AX1, AX2 defining a rotational axis RA1, RA2 around which the respective guiding drums GD1, GD2 can rotate. These axles AX1, AX2 are supported by a first drum support ST1 and a second drum support ST2, respectively, which first and second drum supports ST1, ST2 are moveably guided by a guiding structure GS.

The first and second cable and tubing carriers CTC1, CTC2 run opposite to each other. This allows to connect the first and second guiding drum GD1, GD2 to each other causing the first and second guiding drum to automatically follow the movement of the cable and tubing carriers CTC1, CTC2. However, it is explicitly mentioned here that the first and second guiding drum GD1, GD2 can also be positioned independently from each other.

In the embodiment of FIG. 5, the connection between the first and second drum supports ST1, ST2 acts as a drum positioning device DPD1/2 for both guiding drums GD1, GD2. An advantage of this configuration is that the position of the drum supports ST1, ST2, i.e. the guiding drums GD1, GD2, in the moving direction can be controlled in a passive manner.

In order to apply a substantially constant tension to the first and second cable and tubing carriers CTC1, CTC2, the connection between the first and second drum supports ST1, ST2 can be in the form of a spring SP. Alternatively, the connection between the first and second drum supports ST1, ST2 may be a rigid one (i.e. the first and second drum supports ST1, ST2 are integrated to form a single drum support), and at least one of the cable and tubing carriers CTC comprises a portion with a spring-like behavior.

FIG. 5 further shows a boundary plate BP to keep the cable and tubing carriers CTC1, CTC2 substantially in a predetermined shape. Such a boundary plate BP may additionally or alternatively be provided at the opposite side of the cable and tubing carriers CTC1, CTC2. Boundary plates delimit the moving range of the cable and tubing carriers and/or the set of cables and/or tubing held by the cable tubing carriers. They usually run close to the cable and tubing carrier. Boundary plates may further be used as a safety measure protecting other parts of the object positioning system, in particular the second object OB2, when a cable or tubing of the set of cables and/or tubing breaks or gets loose.

Hence, in an embodiment, the object position system comprises boundary plates to keep the cable and/or tubing carrier substantially in a predetermined shape.

The drum supports ST1, ST2 may further be equipped with a respective motor (not shown) for rotating the respective guiding drum GD1, GD2 supported by said drum supports ST1, ST2.

For all embodiments, it is clear that the guiding structure GS and the first object OB1 may be separate or integrated as one part.

It will be apparent that although all embodiments show cable and tubing carriers mainly extending in a horizontal direction, the invention can also be applied to other directions, including the vertical direction, as well.

The dimensions of the different parts of the object positioning system are preferably optimized with respect to wear and lifetime. For instance, the diameter of the guiding drums may be matched to at least the minimum bending radius of the cables and hoses held by the cable and tubing carriers.

Although all shown embodiments comprise a cable and tubing carrier, it will be apparent to the skilled person that the invention may be applied as well when a cable and tubing carrier is absent and thus the guiding drum is guiding the set of cables and/or tubing in a direct manner. Hence, where applicable, the term cable and tubing carrier may be replaced by a set of cables and/or tubing.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device MA may be pressed into a layer of resist supplied to the substrate W whereupon the resist is cured by applying electromagnetic radiation, heat, pressure or a combination thereof. The patterning device MA is moved out of the resist leaving a pattern in it after the resist is cured.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a first object;
   a second object which is moveable relative to the first object in a moving direction;
   a set of cables and/or tubing arranged between, and connected to, the first object and the second object;
   a guiding drum to guide the set of cables and/or tubing, the guiding drum being rotatable about a rotation axis extending perpendicular to the moving direction;
   a drum positioning device to position the guiding drum such that it follows movement of the set of cables and/or tubing caused by movement of the second object relative to the first object; and
   a guiding structure to guide movement of the guiding drum in the moving direction.

2. The lithographic apparatus according to claim 1, further comprising a cable and tubing carrier configured to hold the set of cables and/or tubing, wherein the guiding drum is configured to guide the set of cables and/or tubing by guiding the cable and tubing carrier.

3. The lithographic apparatus according to claim 1, wherein the drum positioning device comprises a spring to apply a biasing force to the guiding drum to urge the guiding drum in the moving direction towards the set of cables and/or tubing.

4. The lithographic apparatus according to claim 1, wherein the drum positioning device comprises a drum support and a drum actuation system, wherein the drum support is configured to be guided by the guiding structure and support the guiding drum, and wherein the drum actuation system is configured to position the drum support.

5. The lithographic apparatus according to claim 1, wherein the drum positioning device comprises a motor to rotate the guiding drum about its rotation axis.

6. The lithographic apparatus according to claim 1, further comprising a measurement system to measure a position of the second object to obtain a measured position of the second object, an object actuation system to move the second object and an object control system to drive the object actuation system based on the measured position of the second object.

7. The lithographic apparatus according to claim 6, wherein the drum positioning device comprises a drum support and a drum actuation system, wherein the drum support is configured to be guided by the guiding structure and support the guiding drum, and wherein the drum actuation system is configured to position the drum support, and wherein the drum positioning device comprises a drum control system to drive the drum actuation system based on the measured position of the second object.

8. The lithographic apparatus according to claim 4, wherein the drum positioning device comprises a drum control system configured to drive the drum actuation system such that a tension in a part of the set of cables and/or tubing, or in a part of a cable and tubing carrier holding the set of cables and/or tubing, which extends between the guiding drum and the second object is substantially constant.

9. The lithographic apparatus according to claim 1, further comprising:
   a further set of cables and/or tubing arranged between, and connected to, the first and second object;
   a further guiding drum to guide the further set of cables and/or tubing, the further guiding drum being rotatable around a further rotational axis extending perpendicular to the moving direction; and
   a further drum positioning device to position the further guiding drum such that it follows movement of the further set of cables and/or tubing caused by movement of the second object relative to the first object,
   wherein the guiding structure is also configured to guide movement of the further guiding drum in the moving direction.

10. The lithographic apparatus according to claim 1, further comprising:
    a support constructed to support a patterning device, the patterning device being capable of imparting a radiation beam with a pattern in its cross-section to form a patterned radiation beam;
    a substrate table constructed to hold a substrate; and
    a projection system configured to project the patterned radiation beam onto a target portion of the substrate,
    wherein the second object is the support or the substrate table.

11. A method for positioning a second object that is moveable relative to a first object in a lithographic apparatus, the method comprising:
    providing a set of cables and/or tubing arranged between, and connected to, the first object and the second object;
    providing a guiding drum to guide the set of cables and/or tubing, the guiding drum being rotatable about an rotation axis extending perpendicular to the moving direction;
    providing a guiding structure to guide movement of the guiding drum in the moving direction;
    positioning the second object relative to the first object; and
    positioning the guiding drum such that it follows movement of the set of cables and/or tubing caused by movement of the second object relative to the first object.

12. The method according to claim 11, wherein positioning the second object comprises measuring a position of the second object relative to a reference structure to obtain a measured position of the second object, wherein positioning of the second object is carried out on the basis of the measured position of the second object.

13. The method according to claim 12, wherein positioning the guiding drum is carried out by a drum actuation system which is controlled based on the measured position of the second object.

14. A device manufacturing method wherein use is made of a lithographic apparatus according to claim 1.

15. The method according to claim 11, further providing a cable and tubing carrier holding the set of cables and/or tubing, and using the guiding drum to guide the set of cables and/or tubing by guiding the cable and tubing carrier.

16. The method according to claim 11, further comprising apply a biasing force, via a spring, to the guiding drum to urge the guiding drum in the moving direction towards the set of cables and/or tubing.

17. The method according to claim 11, comprising rotating the guiding drum about its rotation axis using a motor.

18. The method according to claim 11, further comprising:
providing a further set of cables and/or tubing arranged between, and connected to, the first and second object;
providing a further guiding drum to guide the further set of cables and/or tubing, the further guiding drum being rotatable around a further rotational axis extending perpendicular to the moving direction; and
positioning the further guiding drum such that it follows movement of the further set of cables and/or tubing caused by movement of the second object relative to the first object,
wherein the guiding structure is also configured to guide movement of the further guiding drum in the moving direction.

19. The method according to claim 11, wherein a tension in a part of the set of cables and/or tubing, or in a part of a cable and tubing carrier holding the set of cables and/or tubing, which extends between the guiding drum and the second object is substantially constant.

20. The method according to claim 11, wherein the lithographic apparatus comprises: a support constructed to support a patterning device, the patterning device being capable of imparting a radiation beam with a pattern in its cross-section to form a patterned radiation beam; a substrate table constructed to hold a substrate; and a projection system configured to project the patterned radiation beam onto a target portion of the substrate,
wherein the second object is the support or the substrate table.

* * * * *